United States Patent
Lai et al.

(10) Patent No.: US 8,633,394 B2
(45) Date of Patent: Jan. 21, 2014

(54) FLEXIBLE PRINTED CIRCUIT BOARD

(75) Inventors: Ying-Tso Lai, Taipei Hsien (TW); Hsiao-Yun Su, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 140 days.

(21) Appl. No.: 12/780,960

(22) Filed: May 17, 2010

(65) Prior Publication Data

US 2011/0253424 A1 Oct. 20, 2011

(30) Foreign Application Priority Data

Apr. 20, 2010 (TW) .............................. 99112302 A

(51) Int. Cl.
*H05K 1/00* (2006.01)

(52) U.S. Cl.
USPC ............ 174/254; 174/261; 174/264; 174/794

(58) Field of Classification Search
USPC .................................. 174/254, 261–264, 794
See application file for complete search history.

(56) References Cited

U.S. PATENT DOCUMENTS

| | | | | |
|---|---|---|---|---|
| 7,110,263 | B2* | 9/2006 | He et al. | 361/794 |
| 2004/0238950 | A1* | 12/2004 | Doan | 257/734 |
| 2007/0241844 | A1* | 10/2007 | Kim et al. | 333/238 |
| 2009/0078452 | A1* | 3/2009 | Pai et al. | 174/254 |
| 2010/0156572 | A1* | 6/2010 | Yang et al. | 333/238 |

* cited by examiner

*Primary Examiner* — Timothy Thompson
*Assistant Examiner* — Andargie M Aychillhum
(74) *Attorney, Agent, or Firm* — Altis Law Group, Inc.

(57) ABSTRACT

A FPCB includes a signal layer, a ground layer, and a dielectric layer lying between the signal layer and the ground layer. At least one high speed signal transmission line is formed on the signal layer. The ground layer has a copper-removed area corresponding to the transmission line. Two ground lines are symmetrically disposed at two opposite sides of the signal transmission line and substantially parallel to the signal transmission line, each ground line and the signal transmission line is spaced at a first predetermined distance. Each ground line and the signal transmission line are spaced at a first predetermined distance.

19 Claims, 4 Drawing Sheets

FLEXIBLE PRINTED CIRCUIT BOARD

BACKGROUND

1. Technical Field

The present disclosure relates to flexible printed circuit boards (FPCBs) and, particularly, to an FPCB for transmitting high speed signals.

2. Description of Related Art

FPCBs include a signal layer and a ground layer parallel to each other; a signal transmission line is formed in the signal layer. Copper foils are formed in the ground layer corresponding to the signal transmission line. High speed signals can be transmitted utilizing electromagnetic induction effect between the signal transmission line and the copper foils. Limited to a relatively small thickness of the FPCB, the distance between the signal layer and the ground layer is relatively small too, resulting in relatively small impendence. However, transmission of high speed signals requires large impedance.

Therefore, it is desirable to provide an FPCB that can overcome the above-mentioned limitations.

BRIEF DESCRIPTION OF THE DRAWINGS

Many aspects of the embodiments should be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Figure 1:
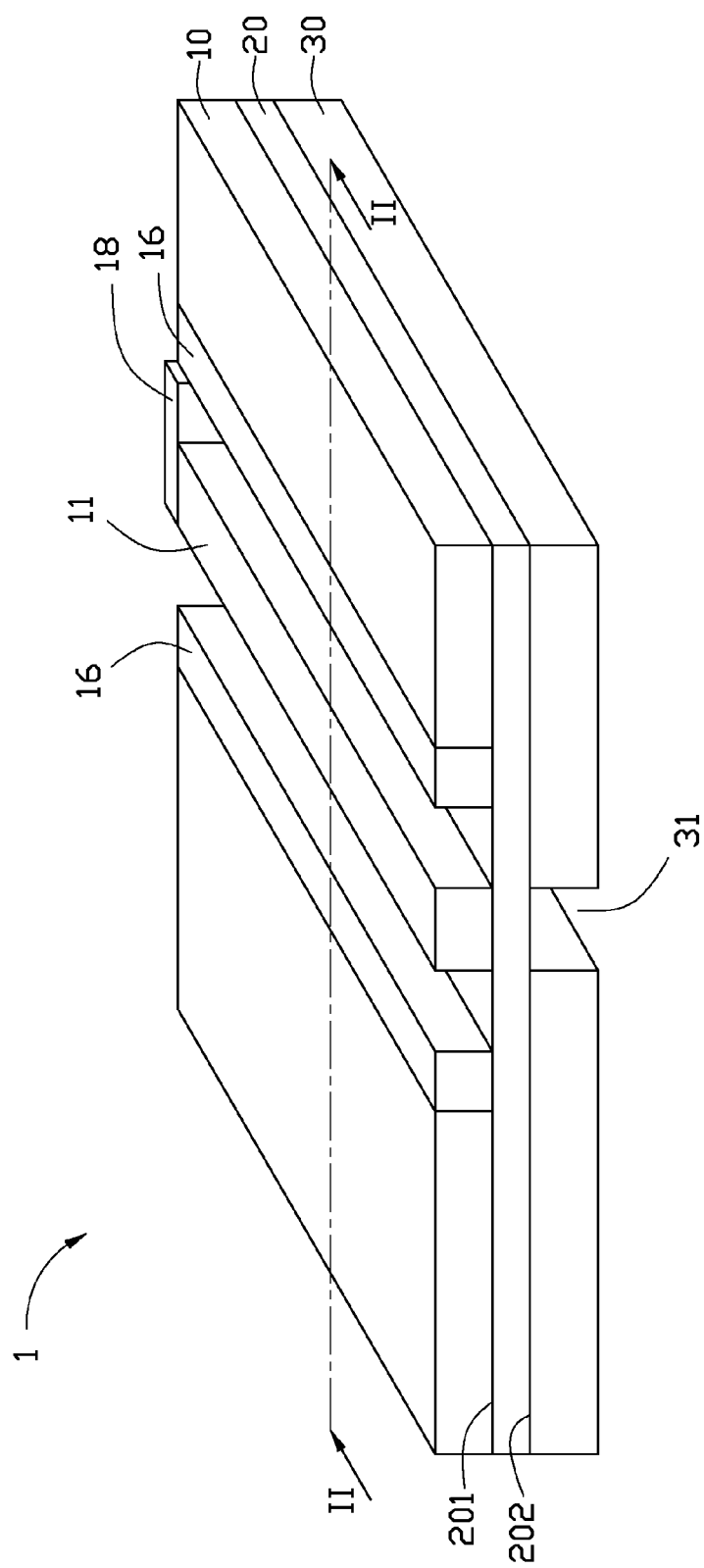
FIG. 1 is a schematic view of an FPCB, according to an exemplary embodiment.
Figure 2:
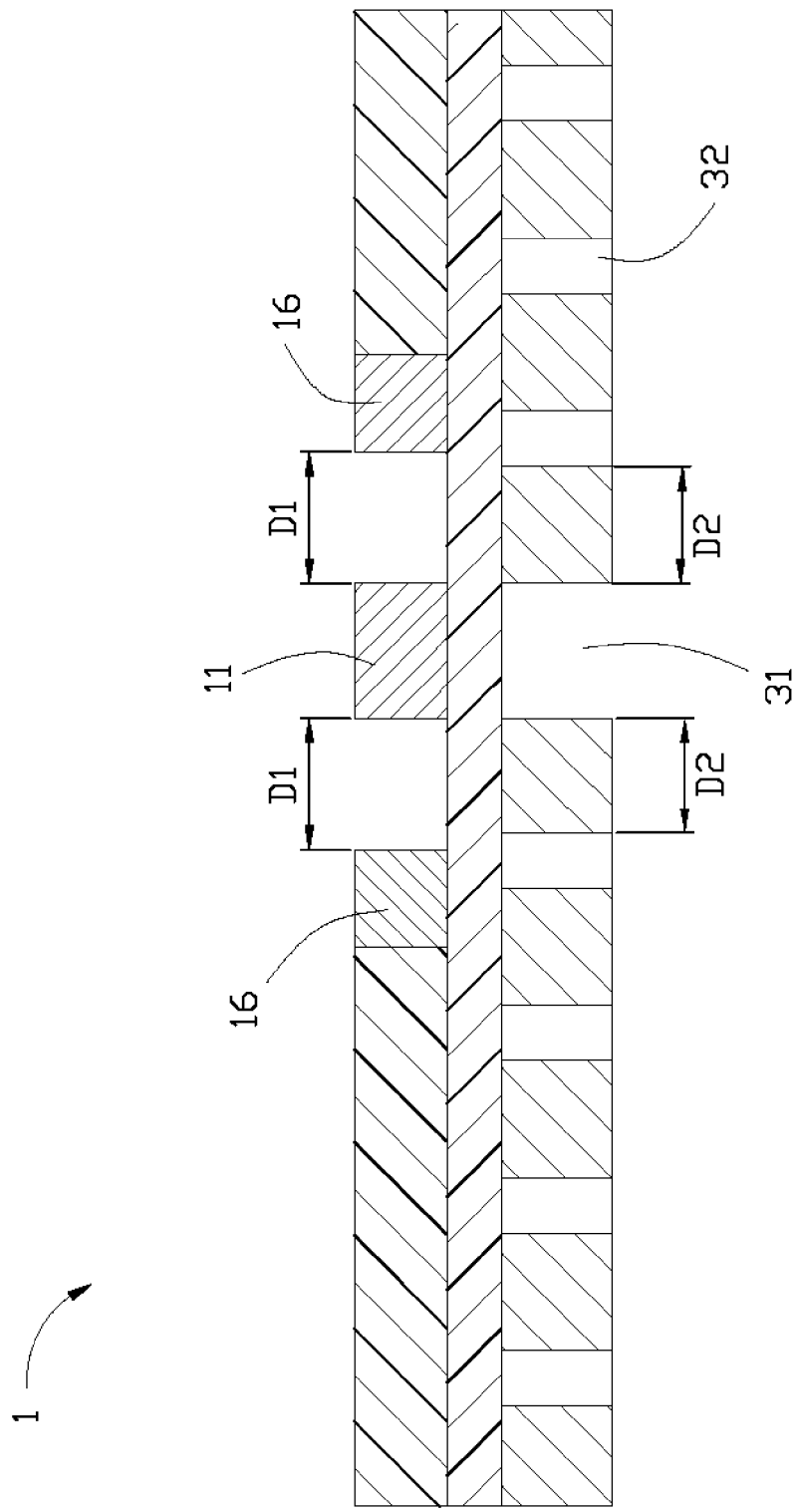
FIG. 2 is a cross-sectional view of the FPCB taken along a line II-II of FIG. 1.

Referring to FIG. 1 and FIG. 2, an FPCB 1, according to an embodiment, includes a signal layer 10, a dielectric layer 20, and a ground layer 30. The dielectric layer 20 includes a first surface 201 and a second surface 202 at opposite sides thereof. The signal layer 10 is formed on the first surface 201 of the dielectric layer 20 and the ground layer 30 is formed on the second surface 202 of the dielectric layer 20. In other words, the signal layer 10 and the ground layer 30 are positioned at the two surfaces 201, 202 of the dielectric layer 20 to sandwich the dielectric layer 20 therebetween.

Figure 3:
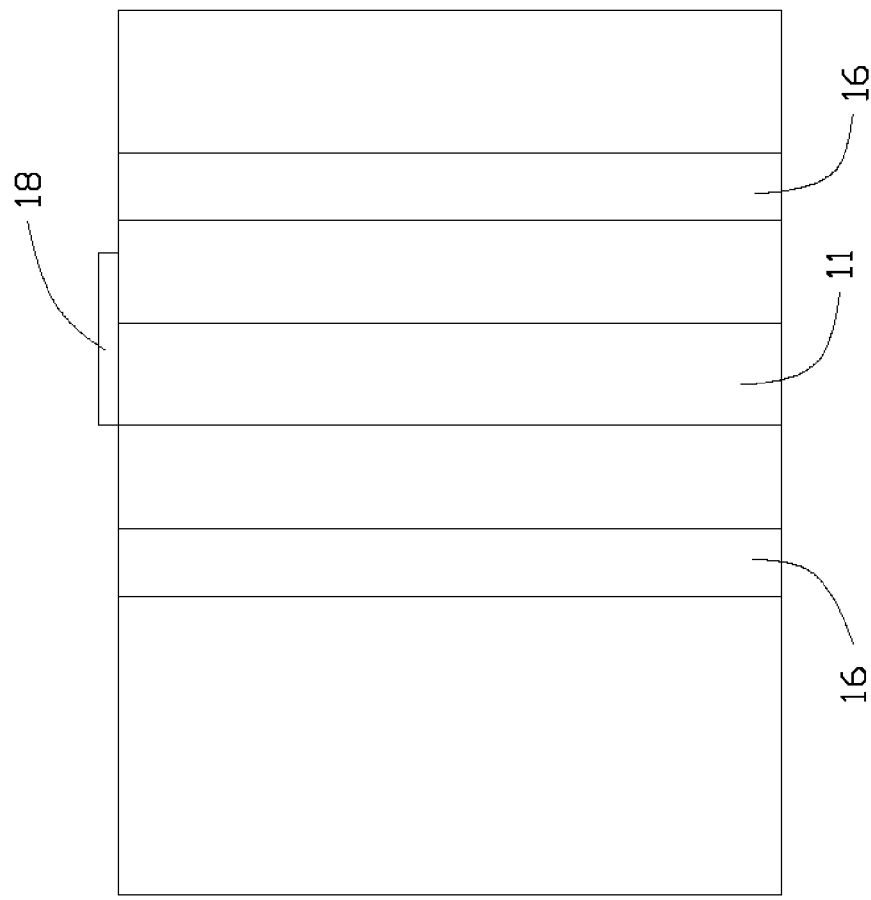
FIG. 3 is a schematic top view of the FPCB of FIG. 1.
Figure 3:

Referring to FIGS. 2-3, a signal transmission line 11, two ground lines 16, and a gold finger 18 are formed in the signal layer 10. The two ground lines 16 are symmetrically disposed at two opposite sides of the signal transmission line 11 and substantially parallel to the signal transmission line 11, to balance the electromagnetism for improving the signal transmitting quality. The ground lines 16 extend as long as the signal transmission line 11. Each ground line 16 and the signal transmission line 11 are spaced at a first predetermined distance D1. Generally, the first predetermined distance D1 is set depending on the type of the high speed signals under transmission. For example, when the signal transmission line 11 transmits IEEE 1394 signals, the first predetermined distance D1 is about 40 mils. When the signal transmission line 11 transmits PCI-EXPRESS signals, the first predetermined distance D1 is about 10 mils. When the signal transmission line 11 transmits USB signals, the first predetermined distance D1 is about 4 mils. The gold finger 18 is formed at one end of the signal transmission line 11 to allow the signal transmission line 11 to be connected to an external line/unit/device (not shown). It should be noteworthy that the numbers of the transmission lines 11, the ground lines 16, and the gold fingers 18 are not limited to this embodiment. In other alternative embodiments, more than one set of transmission line 11, ground lines 16, and gold fingers 18 (one set including a transmission line, two ground lines, and a gold finger) may be employed based on what's needed.

The dielectric layer 20 lies between the signal layer 10 and the ground layer 30. The ground layer 30 defines a copper-removed area 31 corresponding to the signal transmission line 11.

Figure 4:
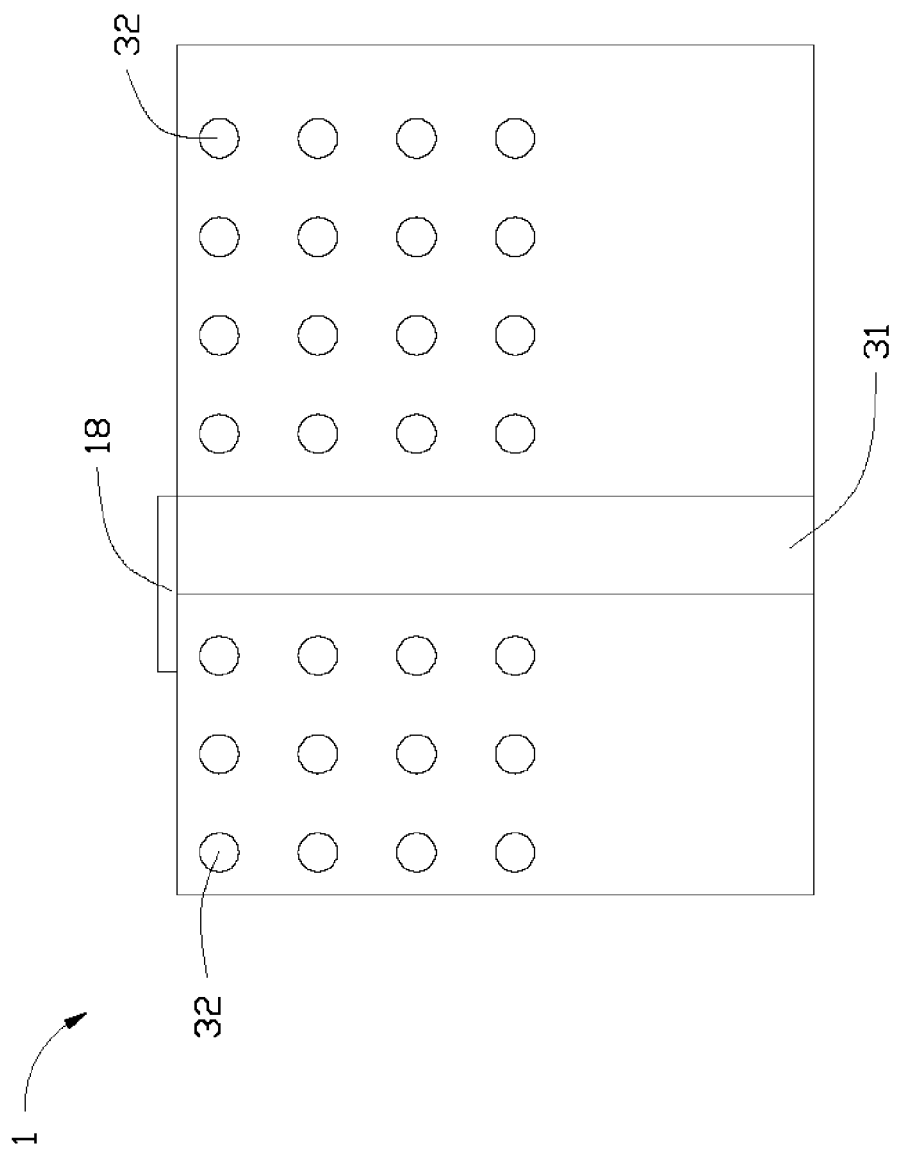
FIG. 4 is a schematic bottom view of the FPCB of FIG. 1.

Referring FIG. 4, to facilitate insertion of the gold finger 18 to an external device, the ground layer 30 defines an array of through holes 32 in the vicinity of the gold fingers 18 to increase a pliability of an area of the FPCB adjacent to the gold finger 18. The through holes 32 are positioned at two opposite sides of the copper-removed area 31. The copper-removed area 31 and the nearest through holes 32 are spaced at a second predetermined distance D2 which is about five times as large as the thickness of the dielectric layer 20. In the present embodiment, the second predetermined distance D2 is 5 mils. In this present embodiment, the through holes 32 are circular holes but can take other geometrical shapes (such as square holes) in other alternative embodiments.

It will be understood that the above particular embodiments and methods are shown and described by way of illustration only. The principles and the features of the present disclosure may be employed in various and numerous embodiments thereof without departing from the scope of the disclosure as claimed. The above-described embodiments illustrate the scope of the disclosure but do not restrict the scope of the disclosure.

What is claimed is:

1. A flexible printed circuit board (FPCB) comprising:
    a dielectric layer comprising a first surface and a second surface at opposite sides thereof;
    a signal layer formed on the first surface of the dielectric layer and comprising at least one signal transmission line and two ground lines, the two ground lines symmetrically disposed at two opposite sides of the signal transmission line and parallel to the signal transmission line, each ground line and the signal transmission line spaced at a first predetermined distance; and
    a ground layer formed on the second surface of the dielectric layer and defining a copper-removed area extending along the direction corresponding to the signal transmission line, the copper-removed area aligned with the signal transmission line on a cross section of the FPCB perpendicular to the direction of the signal transmission line.

2. The FPCB in claim 1, wherein the ground lines extend as long as the signal transmission line.

3. The FPCB in claim 1, wherein when the signal transmission line transmits IEEE 1394 signals, the first predetermined distance is about 40 mils.

4. The FPCB in claim 1, wherein when the signal transmission line transmits PCI-EXPRESS signals, the first predetermined distance is about 10 mils.

5. The FPCB in claim 1, wherein when the signal transmission line transmits USB signals, the first predetermined distance is about 4 mils.

6. The FPCB in claim 1, further comprising at least one gold finger formed at one end of the signal transmission line, wherein the ground layer defines an array of through holes in the vicinity of the gold finger to increase a pliability of an area of the FPCB adjacent to the gold finger.

7. The FPCB in claim 6, wherein the through holes are positioned at two opposite sides of the copper-removed area.

8. The FPCB in claim 7, wherein the copper-removed area and the nearest through holes are spaced at a second predetermined distance.

9. The FPCB in claim 8, wherein the second predetermined distance is about five times as large as the thickness of the dielectric layer.

10. The FPCB in claim 8, wherein the second predetermined distance is 5 mils.

11. The FPCB in claim 8, wherein the through holes are circular holes.

12. The FPCB in claim 8, wherein the through holes are square holes.

13. The FPCB in claim 1, wherein the copper-removed area defines a groove extending as long as the signal transmission line.

14. A flexible printed circuit board (FPCB) comprising:
    a signal layer;
    at least one signal transmission line and two ground lines disposed in the signal layer, the two ground lines symmetrically disposed at two opposite sides of the signal transmission line and parallel to the signal transmission line, each ground line and the signal transmission line spaced at a first predetermined distance;
    a ground layer defining a copper-removed area extending along the direction corresponding to the signal transmission line, the copper-removed area aligned with the signal transmission line on a cross section of the FPCB perpendicular to the direction of the signal transmission line;
    a dielectric layer positioned between the signal layer and the ground layer; and
    at least one gold finger formed at one end of the signal transmission line, wherein the ground layer defines an array of through holes in the vicinity of the gold finger to increase a pliability of an area of the FPCB adjacent to the gold finger.

15. The FPCB in claim 14, wherein the through holes are positioned at two opposite sides of the copper-removed area.

16. The FPCB in claim 15, wherein the copper-removed area and the nearest through holes are spaced at a second predetermined distance.

17. The FPCB in claim 16, wherein the second predetermined distance is about five times as large as the thickness of the dielectric layer.

18. A flexible printed circuit board (FPCB) comprising:
    a signal layer comprising at least one signal transmission line and two ground lines, the two ground lines symmetrically disposed at two opposite sides of the signal transmission line and parallel to the signal transmission line, each ground line and the signal transmission line spaced at a predetermined distance;
    a ground layer defining a copper-removed area extending along the direction corresponding to the signal transmission line, the copper-removed area aligned with the signal transmission line on a cross section of the FPCB perpendicular to the direction of the signal transmission line; and
    a dielectric layer lying between the signal layer and the ground layer;
    wherein at least one gold finger is formed at one end of the signal transmission line, and the ground layer defines an array of through holes in the vicinity of the gold finger to increase a pliability of an area of the FPCB adjacent to the gold finger.

19. The FPCB in claim 18, wherein the through holes are positioned at two opposite sides of the copper-removed area.

* * * * *